(12) United States Patent
Davies, Jr. et al.

(10) Patent No.: US 6,590,416 B1
(45) Date of Patent: Jul. 8, 2003

(54) SUPPLY VOLTAGE INDEPENDENT RAMP-UP CIRCUIT

(75) Inventors: Thomas J. Davies, Jr., Albuquerque, NM (US); Henry A. Om'Mani, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/024,840

(22) Filed: Dec. 18, 2001

(51) Int. Cl.[7] ............................................. H03K 19/177
(52) U.S. Cl. .............................. 326/38; 326/16; 326/39; 326/40; 326/41; 714/724; 714/725
(58) Field of Search ............................... 326/16, 38–41, 326/83; 714/724, 725

(56) References Cited

U.S. PATENT DOCUMENTS

| | | | |
|---|---|---|---|
| 5,821,771 A | * | 10/1998 | Patel et al. .................. 326/38 |
| 5,889,701 A | | 3/1999 | Kang et al. |
| 6,114,843 A | | 9/2000 | Olah |
| 6,150,835 A | * | 11/2000 | Hazen et al. .................. 326/38 |
| 6,288,526 B1 | | 9/2001 | Olah |

OTHER PUBLICATIONS

Xilinx Advance Product Specification DS012 (v1.4) "CoolRunner XPLA3 CPLD" Apr. 11, 2001, pp. 1–10.

* cited by examiner

*Primary Examiner*—Michael Tokar
*Assistant Examiner*—Vibol Tan
(74) *Attorney, Agent, or Firm*—Arthur J. Behiel; Edel M. Young

(57) ABSTRACT

A ramp-up circuit on an integrated circuit receives a relatively high program (erase) voltage for changing the program state of a memory cell. The ramp-up circuit gradually raises the program (erase) voltage to prevent damage to the memory cell. The ramp-up circuit includes a pass gate and associated control circuitry that provides a controlled, ramped-up version of the program (erase) voltage to the memory cell without raising internal circuit nodes above the program (erase) voltage.

19 Claims, 8 Drawing Sheets

1

SUPPLY VOLTAGE INDEPENDENT RAMP-UP CIRCUIT

BACKGROUND

Complex programmable logic devices (CPLDs) are well-known integrated circuits that may be programmed to perform various logic functions. Numerous types of memory elements may be used in CPLD architectures to provide programmability. One such memory element, known as a flash memory cell, is both electrically programmable and erasable. Program and erase are performed on a plurality of flash memory cells using either Fowler-Nordheim tunneling or hot electron injection for programming and Fowler-Nordheim tunneling for erasing. Flash memories can also be in-system programmable (ISP). An ISP device can be programmed, erased, and can have its program state verified after it has been connected, such as by soldering, to a system printed circuit board. Some CPLDs do not have ISP capability and must be programmed externally (outside the system) by programming equipment.

Continuous advances in integrated-circuit process technology have dramatically reduced device feature size. The reduction in feature size improves device performance while at the same time reducing cost and power consumption. Unfortunately, smaller feature sizes also increase a circuit's vulnerability to over-voltage conditions. Among the more sensitive elements in a modern integrated circuit are the gate oxide layers of MOS transistors. These layers are very thin in modern devices, and are consequently easily ruptured by excessive voltage levels. Modern circuits with small feature sizes therefore employ significantly lower source voltages than was common only a few years ago. For example, modern 0.18-micron processes employ supply voltages no greater than 2 volts.

The voltages required to program and erase flash memory cells are dictated by physical properties of the materials used to fabricate memory cells. Unfortunately, these physical properties have not allowed the voltages required to program, erase, and verify the program state of a memory cell to be reduced in proportion to reductions in supply voltages. For example, modern flash memory cells adapted for use with a 0.18-micron processes require program and erase voltages as high as 14 volts, a level far exceeding the required 1.8-volt supply level. For a more detailed treatment of program, erase, and verify procedures, see U.S. Pat. No. 5,889,701, which is incorporated herein by reference.

FIG. 1 (prior art) depicts a conventional CPLD 100. The circuitry within CPLD 100 is instantiated on an integrated circuit chip 105, which is later wire bonded to pins 110 of a device package 115 using a number of bond wires 120. Bond wires 120 connect to respective bond pads 125, some of which extend to respective input/output circuits 130. Input/output circuits 130 convey signals to and from other programmable logic and interconnect resources (not shown). The logic of input/output circuits 130 and these configurable elements is dictated by the program state of a collection of configuration memory cells 135.

Integrated circuits, including CPLDs, undergo substantial test procedures. Among these tests, memory cells are programmed, erased, and their states verified to insure proper device operation. To accomplish this, a sophisticated test apparatus, or "tester," applies and receives signals via pads on the integrated circuit. These pads might be bond pads, like bond pads 125, or dedicated test pads used only to make contact with the tester.

Chip 105 depicts two test-specific pads 145, sometimes called "octal pads," connected to a ramp-up circuit 150. A pair of test pins 155 extends from an external tester (not shown) to pads 145 to convey a relatively high programming voltage VPP and a control signal CTRLB to circuit 150. Circuit 150 uses these two external test signals to develop a ramped version VPP_R of the programming voltage VPP to steering logic 160. While VPP is referred to herein as a "programming" voltage, it is to be understood that the applied voltage on terminal VPP might also be used to erase memory cells. Moreover, as with other designations in the present disclosure, VPP refers to both the signal and the corresponding circuit node. Whether a given designation refers to a node or a signal will be clear from the context.

Steering logic 160 selectively applies the ramped up program voltage VPP_R to the bitlines of memory cells within the box labeled memory cells 135. Though shown in FIG. 1 as a discrete area, memory cells 135 are typically distributed throughout chip 105 to control the various programmable resources. A power line 165 conveys a power-supply voltage VDD from one of external supply pins 110 to I/O circuits 105 and the other internal components (not shown).

FIG. 2 (prior art) depicts a more detailed schematic of ramp-up circuit 150 of FIG. 1. Ramp-up circuit 150 receives as input the relatively high programming voltage VPP on octal pad 145. EEPROM cells can be damaged if programming and erase voltages are applied too quickly. Ramp-up circuit 150 is therefore provided to raise the external program or erase voltages on the respective pad 145 gradually to the appropriate voltage level.

Ramp-up circuit 150 includes a clock terminal 200 adapted to receive a clock signal generated either internally or externally to CPLD 100. Control signal CTRLB is shown here associated with an octal pad 145, but the control signal can also be generated internally, or can be received externally via a different type of pad. The last letter of the designation CTRLB indicates that the control signal is an active low (i.e., the B is for "bar"), and this convention is used throughout the present application.

The clock and control signals are fed into a circuit 205 that divides the clock signal into a pair of complimentary clocks C1 and C2. These clocks are then each fed via respective capacitors to an output circuit 210. Output circuit 210 receives the externally generated high-voltage signal VPP as an additional input, and also receives the compliment CTRL of control signal CTRLB.

When control signal CTRLB is brought low, output circuit 210 ramps up the voltage on the gate of a transistor 215 from zero volts to a level above VPP. The output VPP_R of ramp-up circuit 150 thus gently approaches the requisite program voltage VPP to be directed to the bit line of one or more memory cells. The output VPP_R ramps up over a time RT determined primarily by the clock signal CLK and the values of the capacitors between circuits 205 and 210. The output VPP_R returns to zero when control signal CTRLB is brought high.

The trouble with ramp-up circuit 150 is that the voltage on the gate of transistor 215 must rise above the voltage level VPP. As noted above, modern integrated circuits are becoming ever more sensitive to high voltages, so it is beneficial to keep all voltages presented to CPLD 100 as low as possible.

SUMMARY

The present invention is directed to a ramp-up circuit that receives a relatively high program voltage for changing the program state of a memory cell. The ramp-up circuit gradually raises the program voltage to provide a ramped up version of the programming signal to the memory cells. The gradual ramping of the program voltage prevents damage to the memory cells.

The ramp-up circuit includes a pass gate and associated control circuitry that provides a controlled, ramped-up version of the program voltage to the memory cells without raising internal circuit nodes above the program voltage. This aspect of the invention reduces the maximum voltage required on nodes within the circuit, and therefore protects sensitive components from potentially damaging overvoltage conditions.

This summary does not define the scope of the invention, which is instead defined by the appended claims.

DETAILED DESCRIPTION

Figure 1:
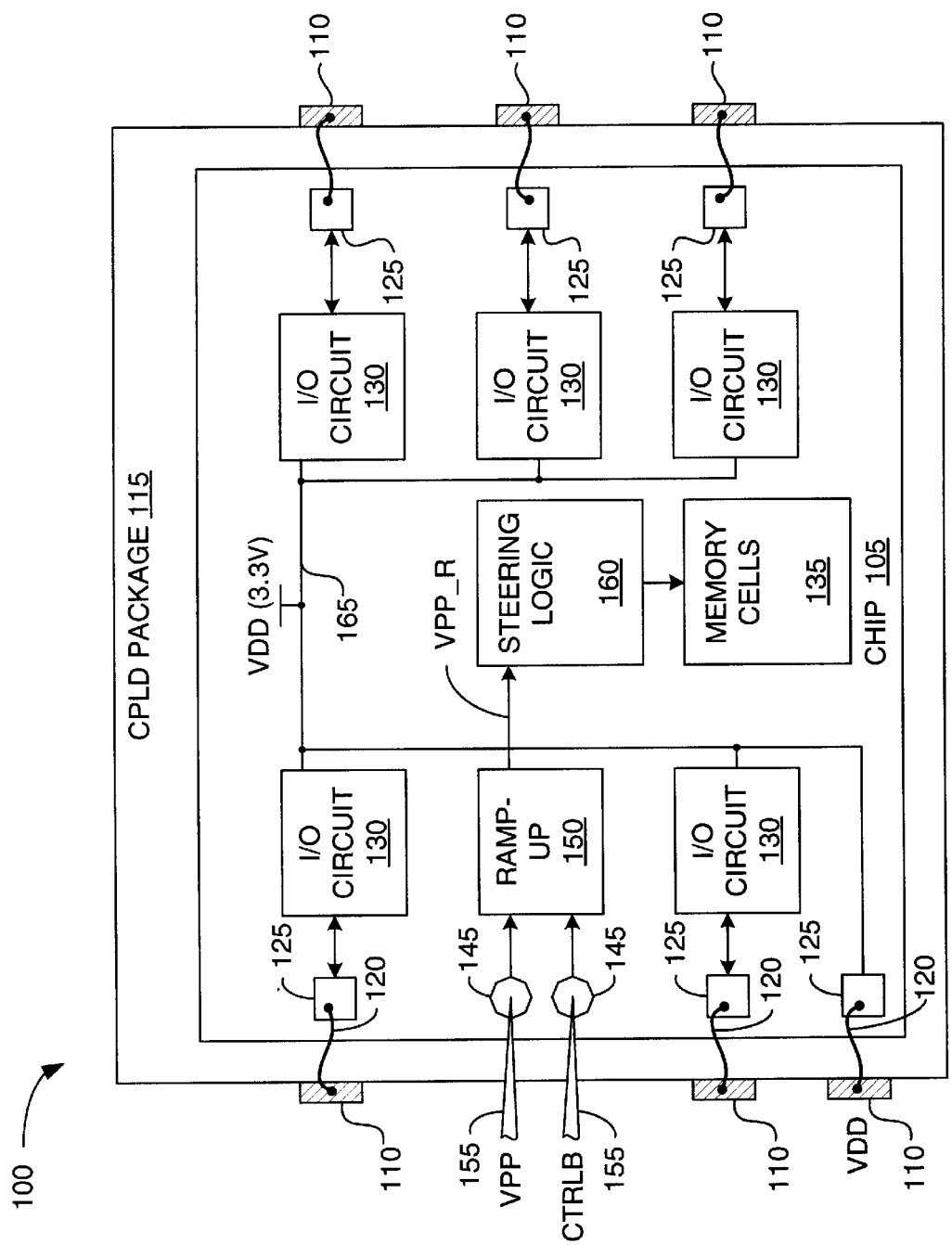
FIG. 1 (prior art) depicts a conventional CPLD 100.
Figure 2:
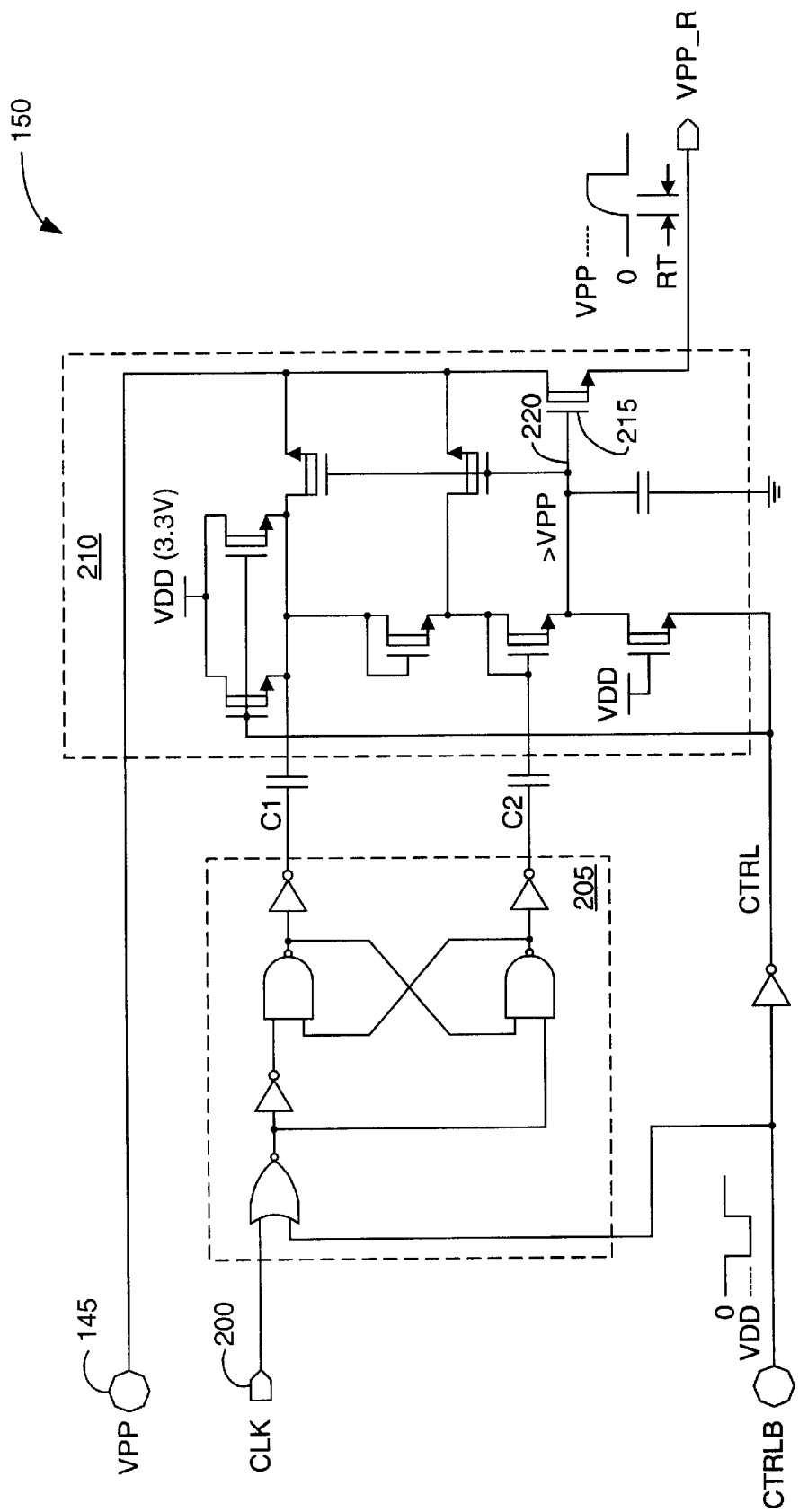
FIG. 2 (prior art) depicts a more detailed schematic of ramp-up circuit 150 of FIG. 1.
Figure 3:
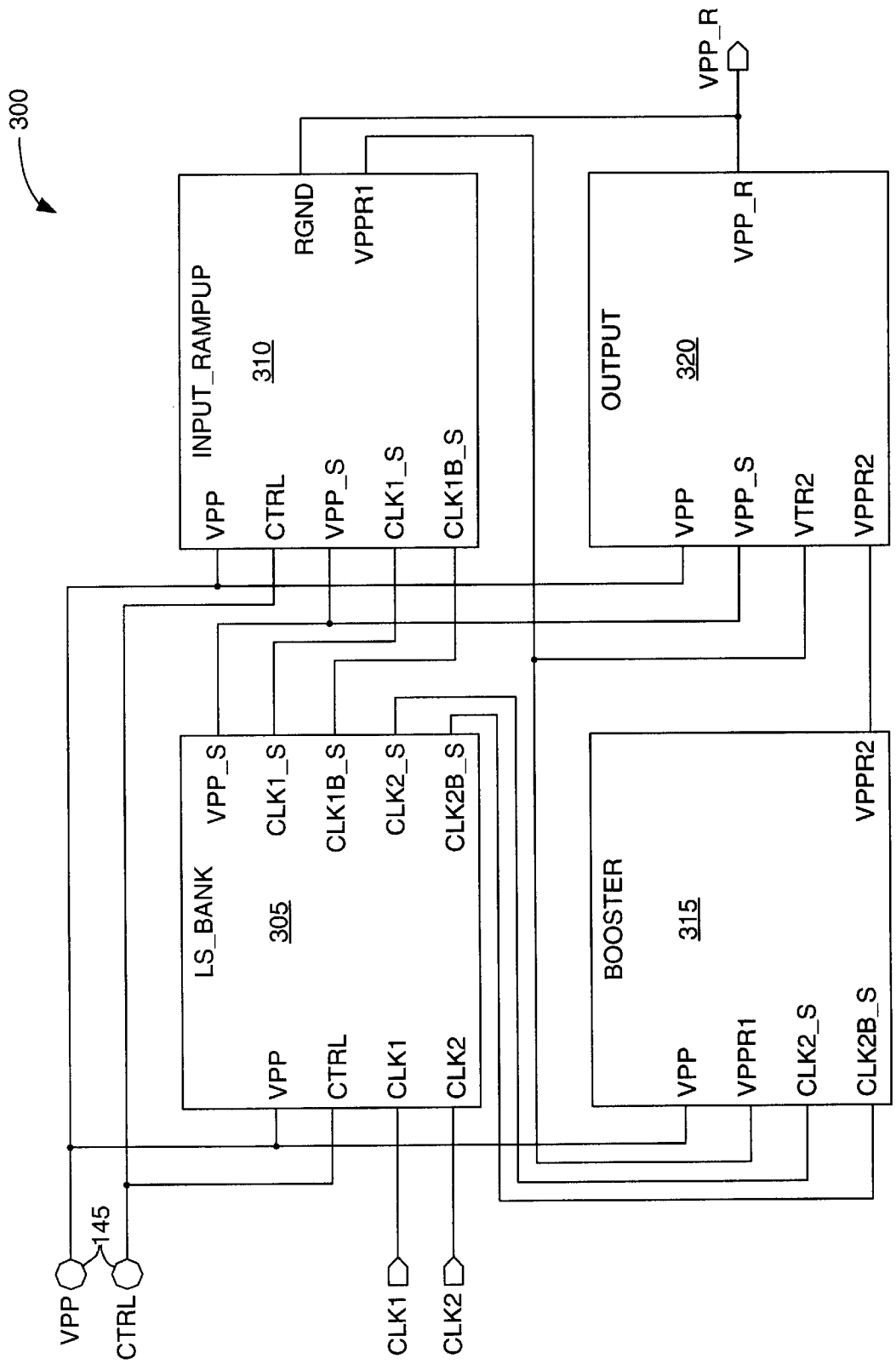
FIG. 3 depicts a ramp-up circuit 300 configured in accordance with the present invention.

FIG. 3 is a block-level depiction of a ramp-up circuit 300 configured in accordance with the present invention. Like ramp-up circuit 150 of FIG. 1, circuit 300 receives a programming (erase) voltage level VPP on an octal pin 145 and creates from that voltage a ramped-up program voltage VPP_R. Unlike circuit 150, however, circuit 300 performs this function without raising internal circuit nodes above the voltage level VPP. This and other advantages are discussed below.

Ramp-up circuit 300 includes a bank of level shifters 305, an input ramp-up sub-circuit 310, a booster sub-circuit 315, and an output stage 320. These elements are detailed below in FIGS. 4–8.

Figure 4:
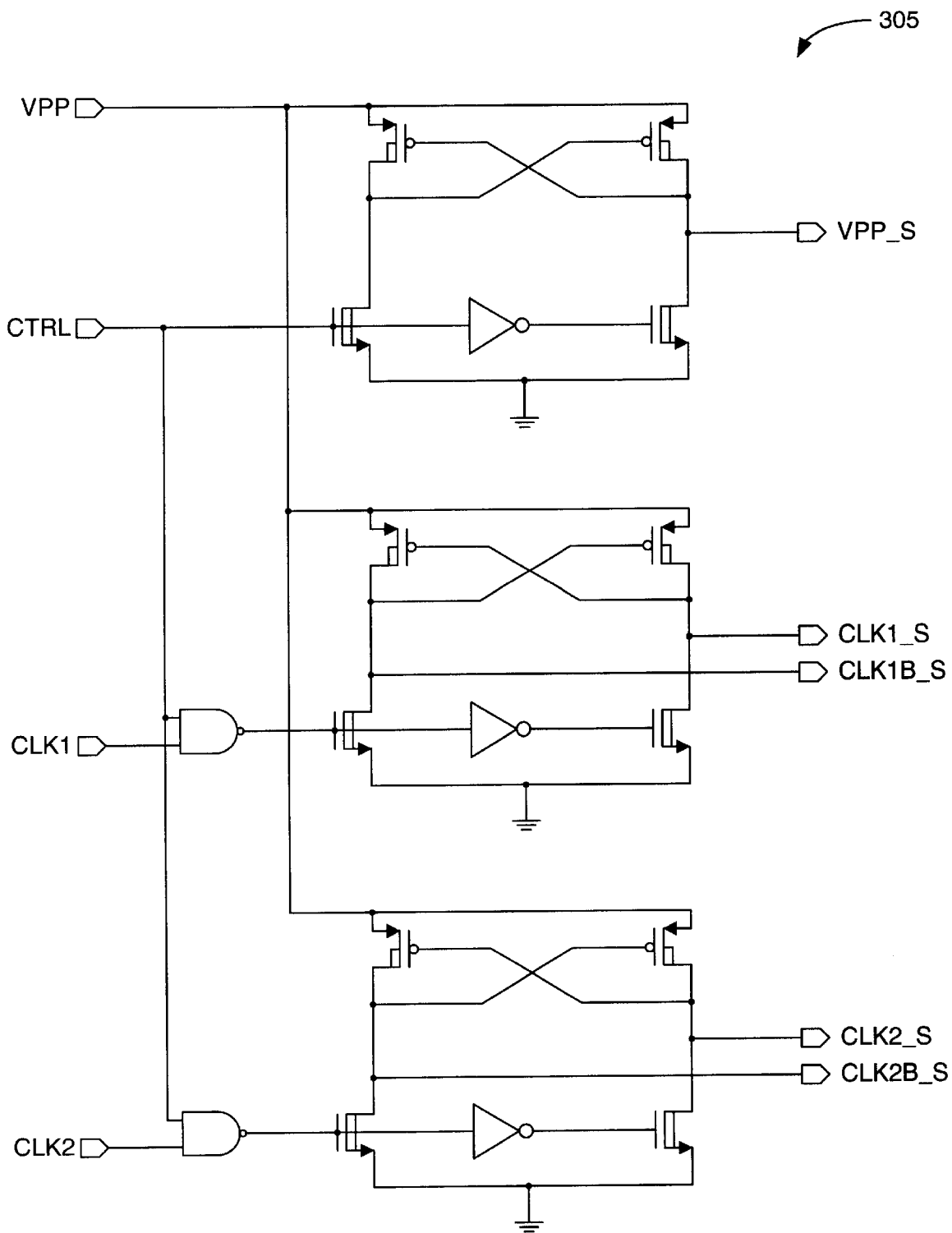
FIG. 4 is a detailed schematic of level shifters 305 of FIG. 3.

FIG. 4 is a detailed schematic of level shifters 305 of FIG. 3. Level shifters 305 receive a control input CTRL and a pair of clock inputs CLK1 and CLK2. These three inputs can be provided externally, developed using CPLD resources, or a combination of the two. The control and clock signals are logic signals that alternate from zero volts to VDD, or between e.g. zero volts and approximately 1.8 volts for CPLDs manufactured using a 0.18-micron process. Level shifters 305 alter the logic levels of these signals, shifting the voltage level representative of a logic one to the programming voltage VPP. Level shifters 305 also develop complimentary clock signals for both CLK1 and CLK2. The level shifted signals are terminated with the letter "S" to indicate that these signals are sourced from level shift circuit 305.

The signal VPP_S is essentially control signal CTRL level-shifted to transition between zero volts and VPP.

Figure 5:
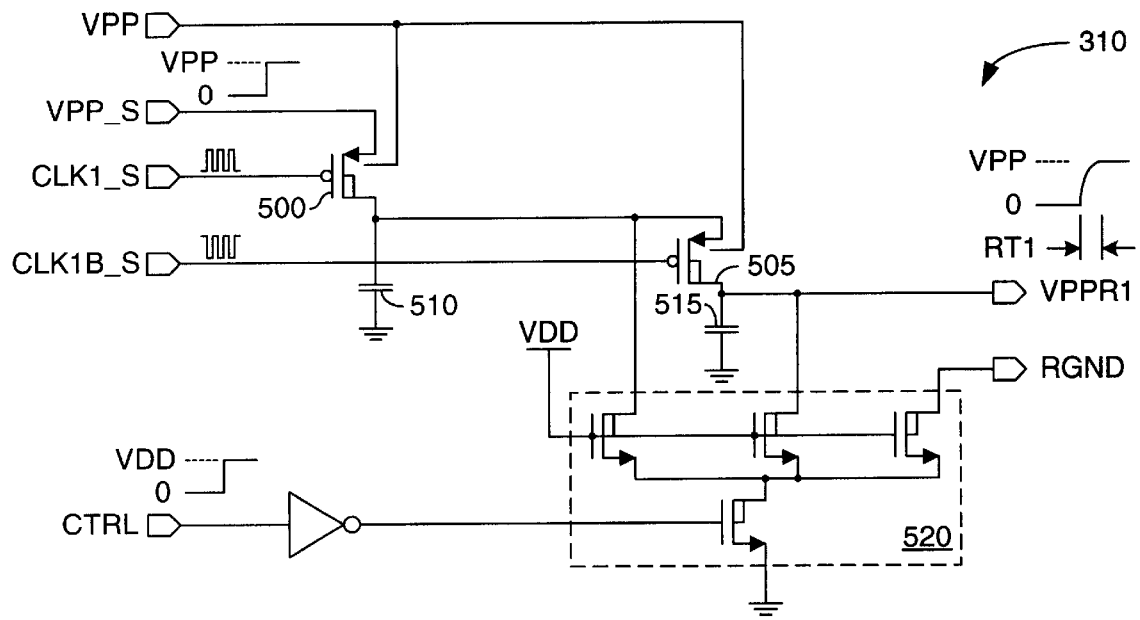
FIG. 5 details input ramp-up sub-circuit 310 of FIG. 3.

FIG. 5 details ramp-up sub-circuit 310 of FIG. 3. Ramp-up sub-circuit 310 receives control signal CTRL, programming voltage VPP, the controlled programming voltage VPP_S from level shift bank 305, and the complementary clocks CLK1_S and CLK1B_S, also from level shift bank 305. Complementary clock signals CLK1_S and CLK1B_S connect to respective transistors 500 and 505. These and other transistors with similarly depicted gate structures are pull-back-drain transistors, which are more voltage tolerant than more typical MOS transistors.

Clock signal CLK1_S periodically turns on transistor 500 to charge a capacitor 510. Clock signal CLK1B_S then turns on transistor 505 to dump the charge collected on capacitor 510 onto a second capacitor 515. Capacitor 510 is substantially smaller than capacitor 515 (400 times smaller in one embodiment), so the output signal on a terminal VPPR1 rises gradually from zero to VPP. The frequencies and duty cycles of clock signals CLK1_S and CLK1B_S can be adjusted to alter the rise time RT1 of signal VPPR1.

Ramp-up sub-circuit 310 includes some control circuitry 520 that removes the charge collected on capacitors 510 and 515 when control signal CTRL is brought low. Control circuit 520 additionally includes an output terminal RGND that grounds the output terminal VPP_R of the entire ramp-up circuit 300, as discussed below in connection with FIG. 7.

Figure 6:
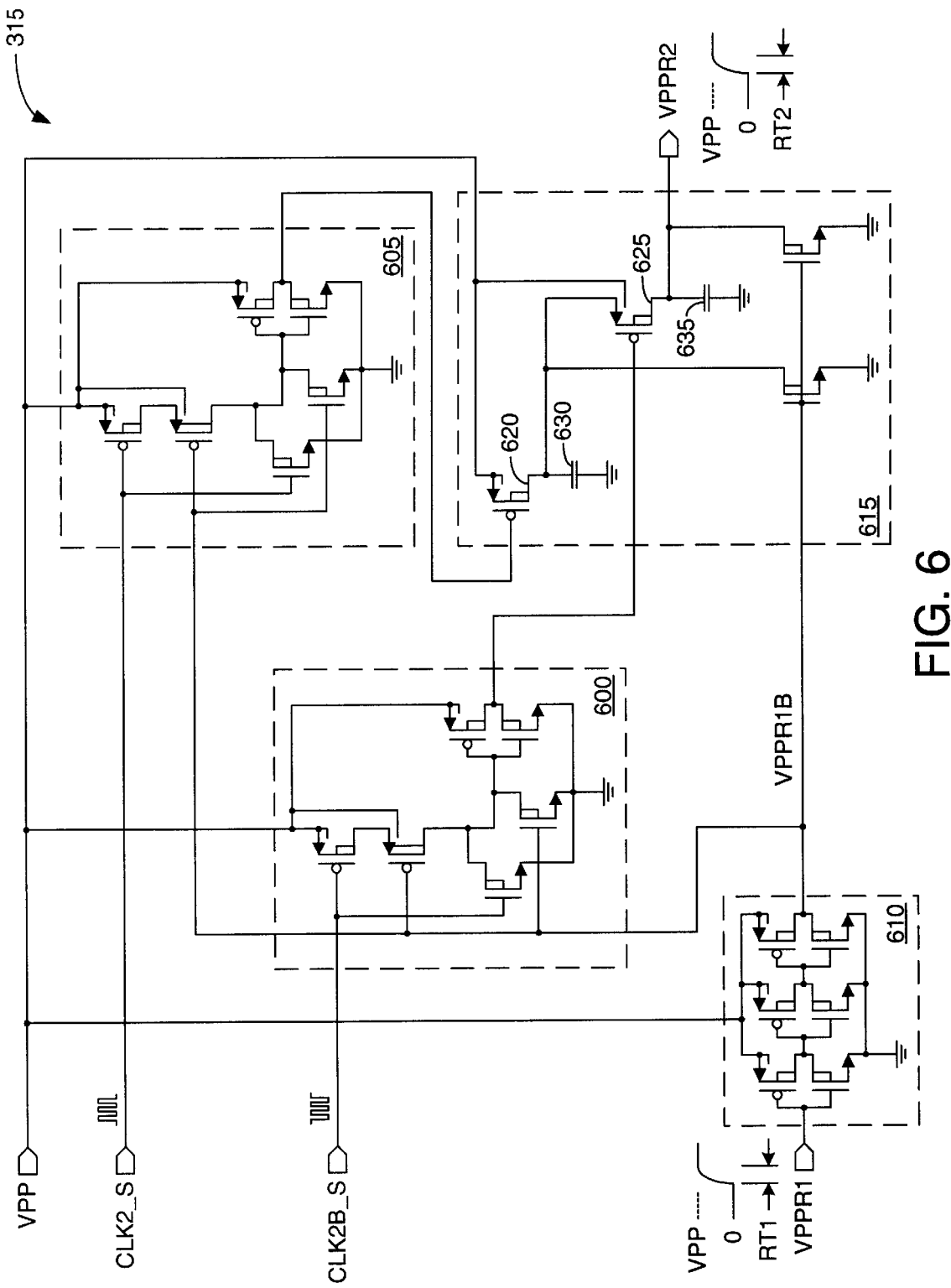
FIG. 6 depicts an embodiment of booster sub-circuit 315 of FIG. 3, another type of ramp-up circuit similar to ramp-up sub-circuit 310 of FIG. 5.

FIG. 6 depicts an embodiment of booster sub-circuit 315 of FIG. 3, another type of ramp-up circuit similar to ramp-up sub-circuit 310 of FIG. 5. Booster sub-circuit 315 receives the programming voltage VPP, the complimentary clocks CLK2_S and CLKK2B_S from level shift bank 305, and the ramped programming voltage VPPR1 from input ramp-up sub-circuit 310. Booster 315 includes a pair of high voltage OR gates 600 and 605, a series of inverters 610, and a ramp-up circuit 615 similar to the ramp-up portion of input ramp-up sub-circuit 310 of FIG. 5.

Inverters 610 conventionally include both PMOS transistors and NMOS transistors. The first PMOS transistor in the series is wider than the first NMOS transistor, so the threshold voltage Vth of the first inverter is close to the threshold voltage of the first PMOS transistor. The second and third inverters are added to sharpen the edge of the resulting inverted version of signal VPPR1 (VPPR1B). The falling edge of signal VPPR1B is delayed from the beginning of the rising edge of ramped up signal VPPR1 by the time required for VPPR1 to rise to within a threshold voltage Vth of programming voltage VPP. In one embodiment, a single inverter takes the place of inverters 610 to save area.

OR gates 600 and 605 OR the inverted ramp signal VPPR1B and respective clock signals CLK2_S and CLK2B_S and provide the resulting complementary output signals to a pair of transistors 620 and 625 within ramp-up circuit 615. Ramp-up circuit 615 functions in the same manner as the similar portion of ramp-up sub-circuit 310, except capacitors 630 and 635 within ramp-up circuit 615 have a ratio of approximately 1 to 225, which is to say that capacitor 630 is 225 times smaller than capacitor 635. Ramp-up sub-circuit 315 produces a second ramp up signal VPPR2, the rise time RT2 of which can be modified by changing the frequencies and duty cycles of clock signals CLK2_S and CLK2B_S. The capacitor values here and in FIG. 5 can also be modified to change the rise time of the various ramped-up voltages.

Figure 7:
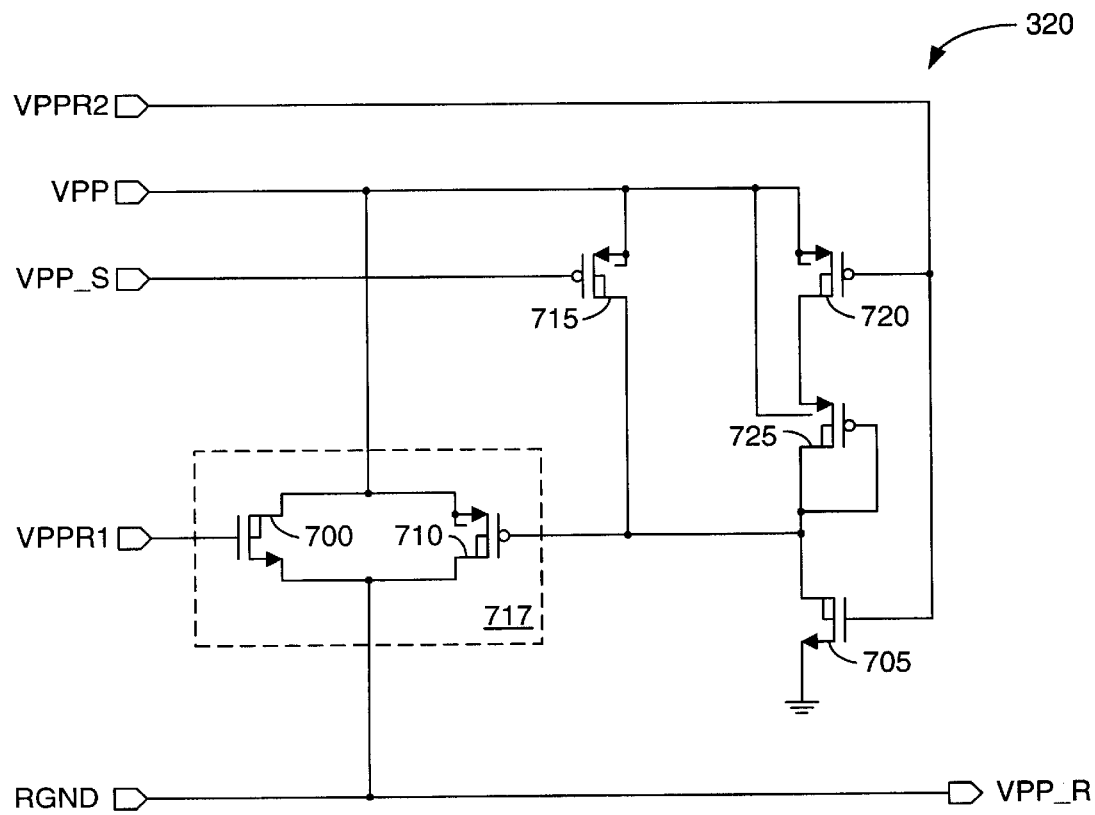
FIG. 7 depicts output stage 320 of FIG. 3.

FIG. 7 depicts output stage 320 of FIG. 3. Output stage 320 receives the first and second ramp-up signals VPPR1 and VPPR2, the program voltage VPP, the controlled program voltage VPP_S sourced from level shift block 305, and the signal RGND from ramp-up sub-circuit 310. Output stage 320 includes two N-type transistors 700 and 705 and four P-type transistors 710, 715, 720, and 715. Transistors 700 and 710 are connected together in parallel to form a pass gate 717 capable of pulling terminal VPP_R substantially to the programming voltage VPP without requiring any node within ramp-up circuit 300 to rise above VPP. The operation of output stage 320 and the remaining circuits within ramp-up circuit 300 is explained below in connection with FIG. 8.

Figure 8:
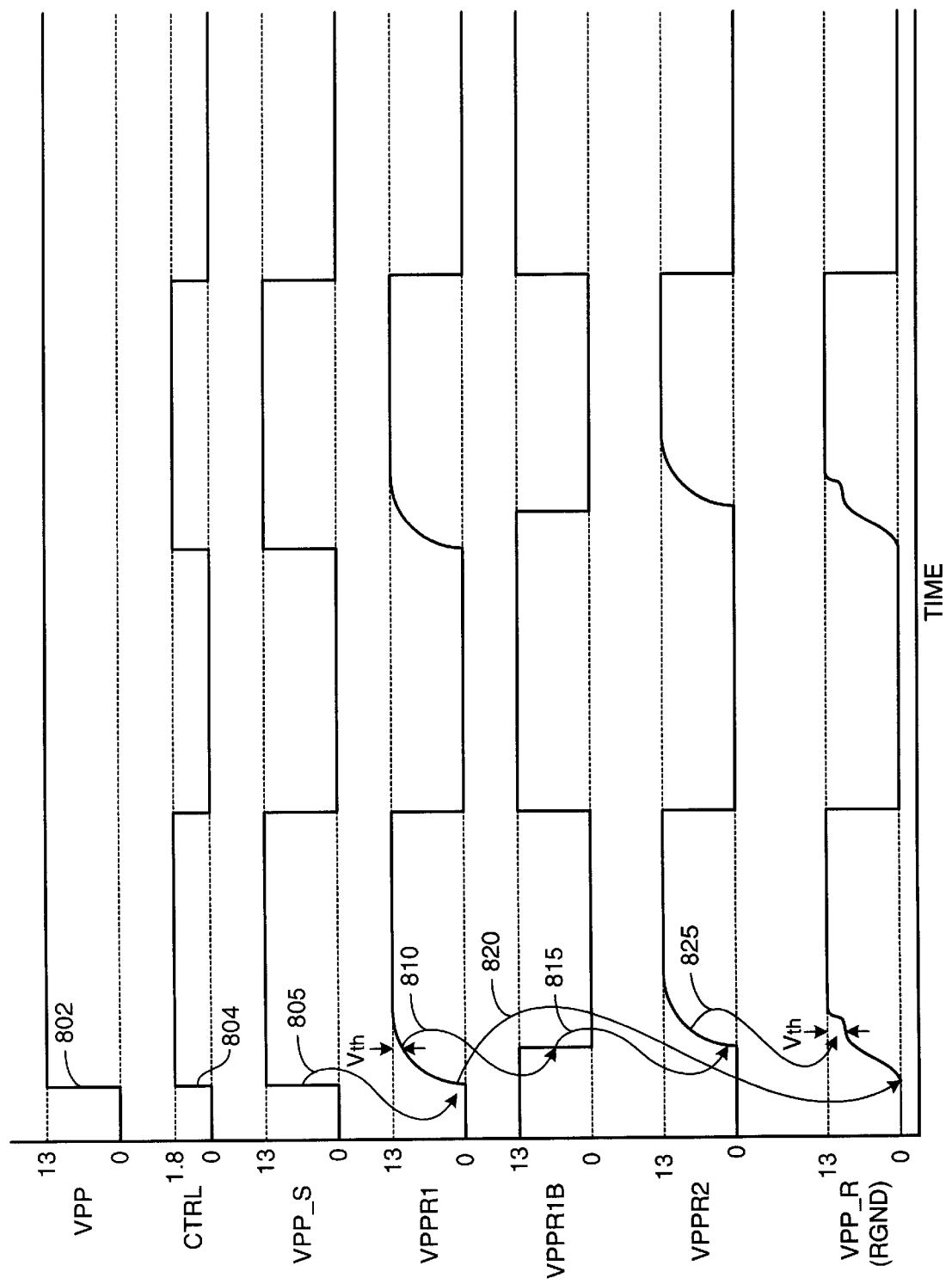
FIG. 8 is a waveform diagram depicting the operation ramp-up circuit 300 of FIG. 3, as detailed in FIGS. 4–7.

FIG. 8 is a waveform diagram depicting the operation of ramp-up circuit 300 of FIG. 3, as detailed in FIGS. 4–7. The process begins when the programming voltage VPP is brought high, to 13 volts for example (edge 802). Next, a control signal CTRL, typically brought in externally from a tester, is brought high to enable the various circuits within ramp-up circuit 300 (edge 804). As a result of the control signal being brought high, level shift circuit 305 produces the controlled version VPP_S of the programming voltage VPP. VPP_S transitions between zero and programming voltage VPP when control signal CTRL transitions between zero and VDD. Although not depicted in FIG. 8, level shifter 305 produces complimentary clock signals that oscillate between approximately zero volts and the programming voltage VPP.

Turning now to FIG. 5, the voltage on terminal VPP_S and the complementary clock signals CLK1_S and CLK1B_S cause the voltage on output terminal VPPR1 (the first ramp-up voltage) to gradually climb from zero volts to approximately VPP, as indicated by arrow 805 of FIG. 8.

Turning next to FIG. 6, inverter chain 610 transitions when the first ramp-up signal VPPR1 rises to approximately within one threshold voltage Vth of the first PMOS transistor of the programming voltage VPP (arrow 810 of FIG. 8). The resulting low voltage on line VPPR1B enables both of OR gates 600 and 605 (FIG. 6), causing their respective outputs to begin oscillating as defined by clocks CLK2_S and CLK2B_S. These clocks then periodically and alternately enable transistors 620 and 625 of ramp-up circuit 615 so that terminal VPPR2 (the second ramp-up voltage) gradually rises from approximately zero volts to VPP. The falling level on line VPPR1B thus initiates the gradual rise of output terminal VPPR2 (arrow 815 of FIG. 8).

Referring now to FIG. 7, the rising edge on the first ramp-up signal VPPR1 gradually turns on transistor 700, thus pulling output terminal VPP_R up toward programming voltage VPP. This transition is depicted in FIG. 8 using arrow 820. Because terminal VPPR1 rises only as high as VPP, transistor 700 cannot, by itself, raise output terminal VPP_R to the level of the programming voltage VPP. However, terminal VPPR2 begins going high after VPPR1, gradually turning on transistor 705 to pull the gate of transistor 710 toward ground potential. Grounding the gate of transistor 710 turns on transistor 710, which then pulls output terminal VPP_R the rest of the way to programming voltage VPP (arrow 825 of FIG. 8). Ramp-up circuit 300 thus achieves the goal of providing a substantially undiminished programming voltage on terminal VPP_R to bit lines of selected memory cells without requiring any internal node on the CPLD to rise above programming voltage VPP.

Returning to FIG. 3, control terminal CTRL is brought low each time steering logic 160 (FIG. 1) is to convey the programming voltage to a different bit line. Returning the control signal CTRL to ground disables each of the elements in FIG. 3, and control circuit 520 of FIG. 5 pulls output terminal VPP_R to ground. The entire cycle then begins again with the next assertion of control signal CTRL.

Figure 9:
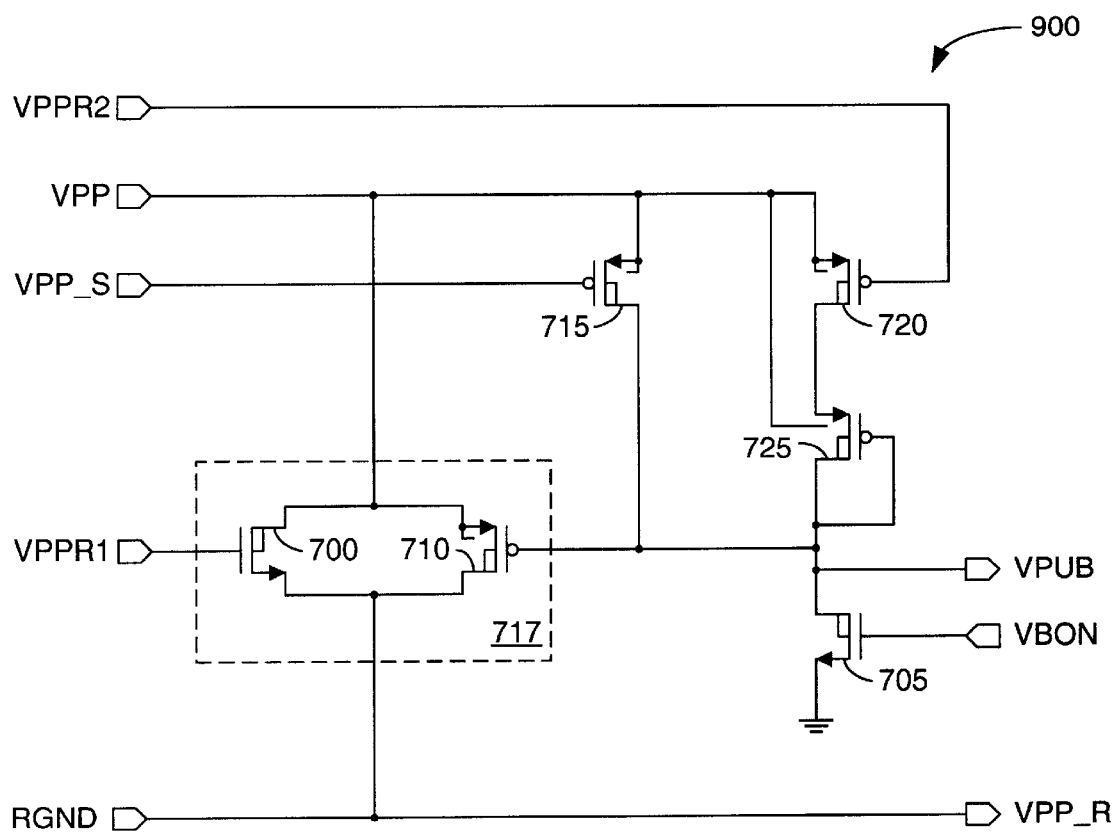
FIG. 9 depicts an output stage 900 similar to output stage 320 of FIG. 7.

FIG. 9 depicts an output stage 900 similar to output stage 320, like-numbered elements being the same. Output stage 900, employed in place of output stage 320 in one embodiment, provides better control over the turn-on time of transistor 705. Output stage 900 differs from output stage 320 in that the gate of transistor 705 receives a control signal VBON, where "BON" stands for "booster on." VBON is a ramped-up signal that weakly follows the rising voltage transitions on terminals VPPR1 and VPPR2, and consequently turns transistor 705 on more slowly than does output stage 320. Also different from output stage 320, a signal VPUB, where "PUB" stands for "pull-up bar," is taken from the node connected to the gate of transistor 710. The source of signal VPUB is depicted below in FIG. 10.

Figure 10:
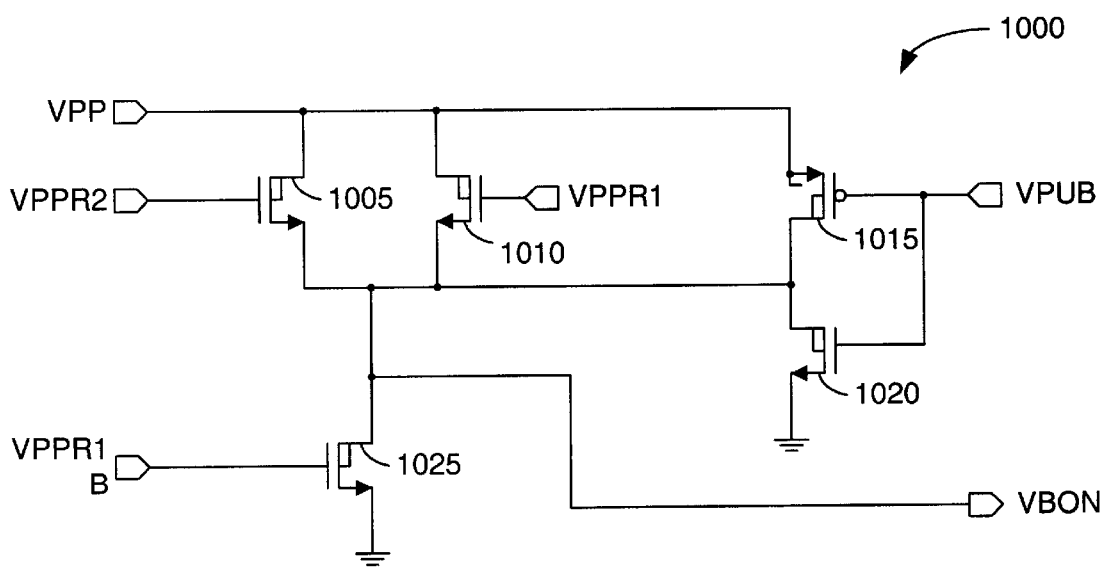
FIG. 10 depicts a circuit 1000 used to generate the signal VBON, which controls transistor 705 in FIG. 9.

FIG. 10 depicts a circuit 1000 used to generate the signal VBON, which controls transistor 705 in FIG. 9. Circuit 1000 includes a pair of parallel-connected NMOS transistors 1005 and 1010, the gates of which connect to respective control signals VPPR2 and VPPR1 (FIGS. 5 and 6). Circuit 1000 also includes a pair of transistors 1015 and 1020, the gates of which connect to terminal VPUB of FIG. 9, and a transistor 1025, the gate of which connects to terminal VPPR1B of FIG. 5.

In operation, signal VBON rises toward VPP as ramp-up signals VPPR2 and VPPR1 turn on respective transistors 1005 and 1010. Transistors 1005 and 1010 are relatively weak, so the maximum voltage on terminal VBON is several threshold voltages below VPP. The weak transistors 1005 and 1010 provide a slow rise time on the gate of transistor 705. As signal VBON rises, transistor 705 pulls node VPUB toward ground, eventually turning on transistors 710 and 1015. As in the embodiment of FIG. 7, transistor 710 pulls output terminal VPP_R all the way to programming voltage VPP; transistor 1015 likewise pulls terminal VBON all the way to programming voltage VPP, and consequently turns on transistor 705 completely. When terminal VPP_S returns to ground, transistors 1020 and 1025 pull terminal VBON to ground. In one embodiment, transistors 1020 and 1025 are replaced with a single transistor controlled by either signal VPPR1B or signal VPUB.

While the present invention has been described in connection with specific embodiments, variations of these embodiments will be obvious to those of ordinary skill in the art. For example, application of the invention is not limited to the above-described CPLD architecture, or even to CPLDs. Moreover, some components are shown directly connected to one another while others are shown connected via intermediate components. In each instance, the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A programmable logic device comprising:
 a. plurality of programmable memory cells;
 b. a test pad adapted to receive a program voltage selected to program at least one of the programmable memory cells; and
 c. a pass gate having:
  i. a pass-gate input terminal;
  ii. a pass-gate output terminal;

iii. an N-type transistor having a first current-handling terminal connected to the test-voltage pad, a second current-handling terminal connected to the pass-gate output terminal, and a first control terminal; and iv. a P-type transistor having a third current-handling terminal connected to the test-voltage pad, a fourth current-handling terminal connected to the signal-gate output terminal, and a second control terminal.

2. The programmable logic device of claim 1, further comprising a voltage ramp-up circuit having a ramp-up-circuit output terminal adapted to ramp-up the voltage to the first control terminal.

3. The programmable logic device of claim 2, further comprising a second voltage ramp-up circuit having a second ramp-up-circuit output terminal adapted to ramp-up the voltage to the second control terminal.

4. The programmable logic device of claim 3, the second voltage ramp-up circuit further comprising an input terminal connected to the first-mentioned ramp-up-circuit output terminal.

5. The programmable logic device of claim 3, wherein the ramp-up of the voltage on the first control terminal occurs before the ramp-up of the voltage on the second control terminal.

6. The programmable logic device of claim 1, wherein the transistors are MOS transistors.

7. The programmable logic device of claim 1, further comprising steering logic having a steering-logic input terminal connected to the pass-gate output terminal, wherein the steering logic is adapted to selectively provide the program voltage to the plurality of memory cells.

8. An integrated circuit comprising:
a. a plurality of electronically programmable memory cells;
b. a device pad adapted to receive a programming voltage, the programming voltage of a voltage level sufficient to program the memory cells;
c. steering logic connected to the memory cells and having an input terminal adapted to receive the programming voltage, the steering logic being adapted to provide the programming voltage to selected ones of the memory cells;
d. a first transistor having a first p-type current-handling terminal connected to the device pad, a second p-type current-handling terminal connected to the steering logic input terminal, and a first control terminal; and
e. a second transistor having a first n-type current-handling terminal connected to the device pad, a second n-type current-handling terminal connected to the steering logic input terminal, and a second control terminal.

9. The integrated circuit of claim 8, wherein the first and second transistors are MOS transistors.

10. The integrated circuit of claim 8, further comprising a voltage ramp-up circuit having a ramp-up-circuit output terminal adapted to provide a first ramped-up signal to the first control terminal.

11. The integrated circuit of claim 10, wherein the ramp-up circuit is adjustable to alter the ramp-up time of the ramped-up signal.

12. The integrated circuit of claim 11, wherein the ramp-up circuit further comprises a clock input terminal adapted to receive a ramp-up clock signal, and wherein the ramp-up time is proportional to the period of the ramp-up clock signal.

13. The integrated circuit of claim 10, further comprising a second voltage ramp-up circuit having a second ramp-up-circuit output terminal adapted to provide a second ramped-up signal to the second control terminal.

14. The integrated circuit of claim 13, wherein the second voltage ramp-up circuit further comprises a second clock input terminal adapted to receive a second ramp-up clock signal, and wherein the ramp-up time of the second ramped-up signal is proportional to the period of the second ramp-up clock signal.

15. An integrated circuit comprising:
a. electronically programmable memory cells;
b. a circuit node adapted to receive a programming signal of a sufficient voltage to program the memory cells;
c. a ramp-up circuit having a ramp-up circuit input node connected to the circuit node and a ramp-up circuit output node, the ramp-up circuit adapted to produce a ramped-up version of the programming signal on the ramp-up circuit output node; and
d. steering logic having a steering logic input terminal connected to the ramp-up circuit output node and a steering logic output node connected to the programmable memory cells, wherein the steering logic is adapted to selectively provide the ramped-up version of the programming voltage to ones of the memory cells;
e. wherein the ramp-up circuit comprises a plurality of ramp-up-circuit nodes, and wherein each node remains at or below the voltage sufficient to program the memory cells.

16. An integrated circuit comprising:
a. electronically programmable memory cells;
b. a circuit node adapted to receive a programming signal of a sufficient voltage to program the memory cells;
c. a ramp-up circuit having a ramp-up circuit input node connected to the circuit node and a ramp-up circuit output node, the ramp-up circuit adapted to produce a ramped-up version of the programming signal on the ramp-up circuit output node;
d. steering logic having a steering logic input terminal connected to the ramp-up circuit output node and a steering logic output node connected to the programmable memory cells, wherein the steering logic is adapted to selectively provide the ramped-up version of the programming voltage to ones of the memory cells; and
e. a pass gate having a pass-gate input terminal connected to the circuit node, a pass-gate output terminal connected to the ramp-up circuit output node, and first and second pass-gate control terminals.

17. The integrated circuit of claim 16, the ramp-up circuit further comprising:
a. a first ramp-up sub-circuit having an input terminal connected to the circuit node and an output terminal connected to the first pass-gate control terminal; and
b. a second ramp-up sub-circuit having an input terminal connected to the circuit node and an output terminal connected to the second pass-gate control terminal.

18. The integrated circuit of claim 15, wherein the circuit node comprises a pad.

19. A programmable logic device comprising:
a. a plurality of circuit nodes;
b. a plurality of programmable memory cells;
c. a test pad adapted to receive a program voltage selected to program at least one of the programmable memory cells; and
d. means for selectively providing a ramped-up version of the program voltage to the memory cells without raising any of the circuit nodes to voltage levels exceeding the program voltage.

* * * * *